United States Patent
Bailey et al.

(10) Patent No.: US 9,456,519 B2
(45) Date of Patent: Sep. 27, 2016

(54) SINGLE UNIT HEIGHT STORAGE SLED WITH LATERAL STORAGE DEVICE ASSEMBLY SUPPORTING HOT-REMOVAL OF STORAGE DEVICES AND SLIDABLE INSERTION AND EXTRACTION FROM AN INFORMATION HANDLING SYSTEM RACK

(71) Applicant: DELL, INC., Round Rock, TX (US)

(72) Inventors: Edmond Bailey, Cedar Park, TX (US); Jimmy Pike, Georgetown, TX (US); Joseph Andrew Vivio, Santa Rosa, CA (US)

(73) Assignee: DELL PRODUCTS, L.P., Round Rock, TX (US)

( * ) Notice: Subject to any disclaimer, the term of this patent is extended or adjusted under 35 U.S.C. 154(b) by 110 days.

(21) Appl. No.: 14/139,833

(22) Filed: Dec. 23, 2013

(65) Prior Publication Data
US 2015/0181748 A1 Jun. 25, 2015

(51) Int. Cl.
*H05K 7/14* (2006.01)

(52) U.S. Cl.
CPC ........ *H05K 7/1488* (2013.01); *Y10T 29/49117* (2015.01)

(58) Field of Classification Search
CPC ............................. H05K 7/1488; H05K 7/10
See application file for complete search history.

(56) References Cited

U.S. PATENT DOCUMENTS

| | | | | |
|---|---|---|---|---|
| 6,108,198 A * | 8/2000 | Lin | .......................... | 361/679.39 |
| 6,310,783 B1 * | 10/2001 | Winch et al. | ................. | 361/797 |
| 6,392,884 B1 * | 5/2002 | Chou | ....................... | 361/679.33 |
| 6,768,638 B2 * | 7/2004 | Shih | ......................... | 361/679.33 |
| 6,853,548 B2 * | 2/2005 | Vanderheyden et al. | ........................ | 361/679.02 |
| 6,906,914 B2 * | 6/2005 | Stamos et al. | .......... | 361/679.31 |
| 7,126,817 B2 * | 10/2006 | Li | ............................ | 361/679.37 |
| 7,189,924 B1 * | 3/2007 | Popescu et al. | ................ | 174/69 |
| 7,589,436 B2 * | 9/2009 | Takahashi et al. | ............ | 307/66 |
| 7,639,486 B2 * | 12/2009 | Champion et al. | ...... | 361/679.32 |
| 7,742,308 B1 * | 6/2010 | King et al. | ..................... | 361/727 |
| 8,427,823 B2 * | 4/2013 | Yamada | ................... | 361/679.39 |
| 8,582,302 B2 * | 11/2013 | Peterson et al. | ............. | 361/724 |
| 2002/0181197 A1 * | 12/2002 | Huang | ........................ | 361/685 |
| 2003/0112596 A1 * | 6/2003 | Shih | .............................. | 361/685 |
| 2003/0117779 A1 * | 6/2003 | Gough et al. | ................. | 361/728 |
| 2005/0257232 A1 * | 11/2005 | Hidaka | ......................... | 720/654 |
| 2007/0091550 A1 * | 4/2007 | Smith et al. | .................. | 361/679 |
| 2009/0152216 A1 * | 6/2009 | Champion et al. | ............ | 211/26 |
| 2009/0262501 A1 * | 10/2009 | Claassen et al. | ............ | 361/701 |
| 2009/0273896 A1 * | 11/2009 | Walker et al. | ............ | 361/679.33 |
| 2010/0271766 A1 * | 10/2010 | Lin | ............................ | 361/679.02 |
| 2011/0056895 A1 * | 3/2011 | Tichy | .............................. | 211/26 |
| 2011/0090633 A1 * | 4/2011 | Rabinovitz | .............. | 361/679.31 |

(Continued)

*Primary Examiner* — Xanthia C Cunningham
(74) *Attorney, Agent, or Firm* — Isidore PLLC (57) ABSTRACT

A rack-based information handling system (IHS) includes a rack containing at least one chassis having a plurality of bays open to laterally receive sleds that contain a plurality of information technology (IT) components that, when operational, enable the rack to function as an IHS. A storage sled including a stationary tray received in the chassis and a moveable trace received in the stationary tray. One or more hot swap bays that are horizontally arrayed in the storage sled in less than one (1) Server System Infrastructure (SSI) rack unit of height, wherein the moveable tray is extendable from the rack to a service position to expose all of its hot swap bays. Storage devices are insertable into a respective one of the hot swap bays of the storage sled. Each storage device may include a latching handle to lift and downward position the storage device in the corresponding hot swap bay.

17 Claims, 9 Drawing Sheets

(56) References Cited

U.S. PATENT DOCUMENTS

| | | | |
|---|---|---|---|
| 2011/0100933 A1* | 5/2011 | Kitten | 211/1 |
| 2011/0284422 A1* | 11/2011 | Yamada | 206/701 |
| 2012/0069514 A1* | 3/2012 | Ross | 361/679.33 |
| 2012/0229987 A1* | 9/2012 | Peng et al. | 361/724 |
| 2012/0263989 A1* | 10/2012 | Byun et al. | 429/99 |
| 2013/0021740 A1* | 1/2013 | Hamand et al. | 361/679.31 |
| 2013/0242501 A1* | 9/2013 | Chen et al. | 361/679.33 |
| 2013/0265714 A1* | 10/2013 | Tsao | 361/679.53 |
| 2013/0342990 A1* | 12/2013 | Jau et al. | 361/679.39 |
| 2014/0108692 A1* | 4/2014 | Doglio et al. | 710/300 |
| 2014/0126144 A1* | 5/2014 | Kyle et al. | 361/679.58 |
| 2015/0086017 A1* | 3/2015 | Taylor et al. | 380/270 |

* cited by examiner

SINGLE UNIT HEIGHT STORAGE SLED WITH LATERAL STORAGE DEVICE ASSEMBLY SUPPORTING HOT-REMOVAL OF STORAGE DEVICES AND SLIDABLE INSERTION AND EXTRACTION FROM AN INFORMATION HANDLING SYSTEM RACK

BACKGROUND

1. Technical Field

The present disclosure generally relates to an information handling system and in particular to a storage sled for a modular, scalable, and expandable rack-based information handling system and design.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Rack-based IHS typically includes processing nodes and storage nodes that support the execution of multiple high-reliability processes, requiring continuous uptime of the various components. Maintenance and/or upgrades to the processing nodes and/or storage nodes can create an unacceptable disruption to ongoing processes. While replicating all of the capabilities of the rack-based IHS has been proposed as a solution to handle such disruptions, this solution is often impractical and unacceptable due to the increased expense in maintaining the duplicated amount of processing capabilities and/or storage capacity. Also, with conventional rack-level storage systems, the amount of space utilized in the rack to host the storage devices can be significant, reducing the available space for processing nodes.

BRIEF SUMMARY

The illustrative embodiments of the present disclosure provide a rack-based information handling system (RIHS) that includes a rack containing at least one chassis having a plurality of bays open to laterally receive sleds that contain a plurality of information technology (IT) components, which enable the rack to function as an Information Handling System (IHS) or a rack storage system. A storage sled has a stationary tray that is received in the chassis and has a movable tray received in the stationary tray that is extendable out from the rack to a service position to expose all of multiple hot swap bays that are horizontally arrayed in the storage sled. Storage devices are insertable into respective ones of the hot swap bays of the storage sled. In one embodiment, the hot swap bays are horizontally arrayed in the storage sled in less than one (1) Server System Infrastructure (SSI) rack unit of height. In one embodiment, each storage device includes a latching handle having (i) an upward position to lift the storage device from the corresponding hot swap bay and (ii) a downward position to lock the storage device in the corresponding hot swap bay.

According to at least one aspect of the present disclosure, a storage sled is provided for an RIHS having a rack that contains at least one chassis having a plurality of bays open to laterally receive one or more sleds. The storage sled has a stationary tray that is received in the chassis and includes a movable tray that can be received in the stationary tray and is extendable from the rack to a service position to expose all of one or more hot swap bays. One or more storage devices are insertable into respective ones of the one or more hot swap bays of the storage sled. In one embodiment, the hot swap bays are horizontally arrayed in the storage sled in less than one SSI rack unit of height. In one embodiment, each storage device includes a latching handle having (i) an upward position to lift the storage device from the corresponding hot swap bay and (ii) a downward position to lock the storage device in the corresponding hot swap bay.

According to at least one aspect of the present disclosure, a method is provided for supporting hot swapping of storage devices in a modular, scalable/expandable RIHS. The method includes assembling a rack containing at least one chassis having a plurality of bays open to laterally receive one or more sleds that contain a plurality of IT components that, when operational, enable the rack to function as an IHS. The method includes providing a storage sled having a stationary tray that is received in the chassis and a moveable tray received in the stationary tray. The method includes providing one or more hot swap bays that are horizontally arrayed in the storage sled. In one embodiment, the method includes horizontally arraying the hot swap bays in the storage sled in less than one SSI rack unit of height. In one embodiment, the method includes providing one or more storage devices that are insertable into a respective one of the one or more hot swap bays of the storage sled, each storage device comprising a latching handle having (i) an upward position to lift the storage device from the corresponding hot swap bay and (ii) a downward position to lock the storage device in the corresponding hot swap bay.

According to at least one aspect of the present disclosure, a method is disclosed for providing storage devices to support hot swapping of storage devices for a modular, scalable/expandable rack-based IHS. The method includes providing one or more storage devices that are insertable into a respective one of one or more hot swap bays horizontally arrayed in a moveable tray of a storage sled of a rack in less than one (1) SSI rack unit of height, wherein the moveable tray is extendable from the rack to a service position to expose all of one or more hot swap bays that are horizontally arrayed in the storage sled. The method further includes providing a latching handle of each storage device having (i) an upward position to lift the storage device from the corresponding hot swap bay and (ii) a downward position to lock the storage device in the corresponding hot swap bay.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

A rack-based information handling system (IHS) is designed to be advantageously modular and scalable in deploying and servicing storage devices. In one illustrative use, a low profile sled containing horizontally-arrayed hot swap bays can receive storage devices such as hard disk drives that are readily lowered and locked into place by a handle. Hot swapping of components with relatively low service reliability is provided in order to meet up time requirements for the rack-based IHS. A movable tray that slides within a stationary tray of the sled can move fully to a service position exposing the hot swap bays. In an exemplary aspect, a cable extension arm between the movable tray and the stationary tray maintains power and signals to the hot swap bays during servicing.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
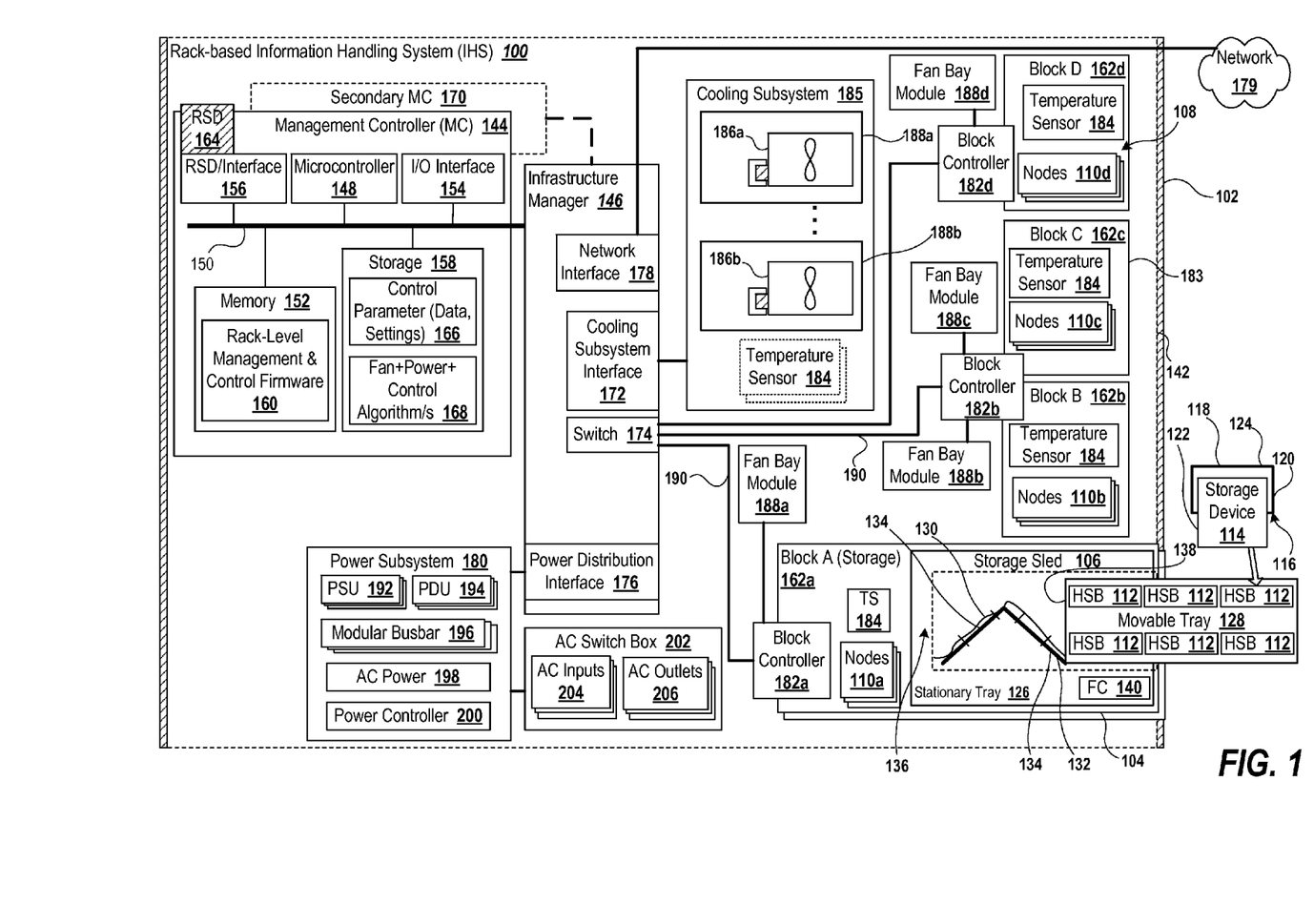
FIG. 1 illustrates a block diagram of an example information handling system (IHS) within which various aspects of the disclosure can be implemented, according to one or more embodiments.

FIG. 1 illustrates a two-dimensional block diagram representation of an example rack-based information handling system (IHS) 100, within which one or more of the described features of the various embodiments of the disclosure can be implemented to support hot swapping of storage devices for a modular, scalable/expandable RIHS. As a two-dimensional image, certain of the presented components are shown in different orientations relative to each other for simplicity in describing the connectively of the components. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

In one embodiment, the rack-based (IHS) 100 includes a rack 102 containing at least one chassis 104 open to laterally receive one or more sleds 106 that can contain a plurality of information technology (IT) components that, when operational, enable the rack 102 to function as an IHS 100. For example, the chassis 104 can contain computing nodes 110. In an exemplary aspect, the chassis 104 receives a storage sled 106a that includes a stationary tray 126 received in the chassis 104 and a movable tray 128 received in the stationary tray 126. The movable tray 128 is extendable from the rack 102 to a service position to expose all of one or more hot swap bays (HSB) 112 that are horizontally arrayed in the moveable tray 128 of the storage sled 106a. One or more storage devices 114 are insertable into a respective one of the one or more HSBs 112 of the storage sled 106a. For example, the storage devices 114 may be hard disk drives. Each storage device 114 includes a latching handle 116 having (i) an upward position to lift the storage device 114 from the corresponding HSB 112 and (ii) a downward position to lock the storage device 114 in the corresponding HSB 112. In one embodiment, the latching handle 116 may include a pivoting bail 118 having opposing pivoting arms 120 attached at respective lateral sides 122 of the storage device 114 and connected by a gripping component 124. The opposing pivoting arms 120 each have a length sized for the gripping component 124 to stow in horizontal alignment adjacent to or flush overtop of the storage device 114, according to one or more embodiments.

It should be appreciated that the electrical connections between the HSB 112 and storage device 114 can have a sufficient interference fit to lock the storage device 114 into the movable tray 128 without necessarily requiring a locking mechanism. The latching handle 116 can provide sufficient manual access for removal whereas insertion may be accomplished by pressing down on the storage device 114 in addition to manipulation of the latching handle 116. Lowering the latching handle 116 may confirm that the storage device 114 is engaged fully in the HSB 112. For example, the movable tray 128 can lack sufficient clearance to be stowed/inserted into the bay if the storage device 114 is not fully engaged in the HSB 112 and the latching handle 116 is correspondingly not fully retracted. Alternatively, a latching mechanism can move with the latching handle to physically engage the latching handle 116 with the HSB 112 to mitigate any susceptibility to vibration or movement of the rack 102.

In one embodiment, the storage sled 106a includes a stationary tray 126 that is attachable to the chassis 104 and a movable tray 128 that contains the one or more hot swap bays 112. The movable tray 128 is slidable and is received within the stationary tray 126. One or more flexible power and signals cables 130 reside in the stationary tray 126. The one or more flexible power and signals cables 130 electrically connect at one end to the plurality of IT components 108 and at another end to the one or more HSBs 112 of the movable tray 128. The one or more flexible power and signal cables 130 are positioned to be movable between a stowed position and a service position of the movable tray 128.

In one embodiment, the storage sled 106a further comprises a cable extension arm 132 to which the one or more flexible power and signals cables 130 may be lengthwise attached. The cable extension arm 132 may include two or more arm segments 134 that are pivotally attached to one another. Terminal ends of cable extension arm 132 may be pivotally attached respectively to an inner end 136 of the stationary tray 126 and an inserted side 138 of the movable tray 128. The cable extension arm 132 is positioned to be moveable between a stowed position and a service position of the movable tray 128. Other functional components 140 may reside in the stationary tray to communication with and functionally support the HSBs 112 in the movable tray 128. The cable extension arm 132 also allows for utilization within the rack of a block chassis that can be of different depths, so that smaller depth blocks are accommodated within the rack chassis.

In one embodiment, the one or more HSBs 112 are horizontally arrayed in the movable tray 128 of the storage sled 106 in less than one (1) Server System Infrastructure (SSI) rack unit of height. For example, in an exemplary embodiment, the storage sled 106a may include twelve (12) hot-swap hard drive devices (HDDs) arranged in a horizontal orientation as storage devices 114.

Although the illustrative embodiment facilitates servicing of components such as HDDs that may fail periodically, it should be appreciated that other functional components of the IHS 100 can benefit from use of an identical or similar cable extension arm to support the insertion and removal of the particular component sled from the rack chassis.

As presented in FIG. 1, IHS 100 includes a rack casing 142, which can comprise one or more panels of sheet metal or other material interconnected to form a three dimensional volume generally referred to in the industry as a rack. Unique aspects of the rack casing 142, which add to the modularity and expandability of IHS 100, are further illustrated and described in one or more of the three-dimensional figures presented herein. As is further presented by these three-dimensional figures, certain components indicated herein are located internal to the rack casing 142 while other components can be located external to rack casing 142. These various components are communicatively connected to one or more components via power and communication cables, which are generally represented by the connecting lines of FIG. 1.

IHS 100 comprises a hierarchical arrangement of multiple management modules, along with power and cooling components, and functional processing components or IT components 108 within end nodes. At the rack level, IHS 100 includes a management controller (MC) 144 communicatively connected to infrastructure manager/module (IM) 146. MC 144 can also be referred to as a Rack Management Controller (RMC). MC 144 includes a microcontroller 148 (also generally referred to as a processor) which is coupled via an internal bus 150 to memory 152, I/O interface 154, removable storage device (RSD) interface 156 and storage 158. Memory 152 can be flash or other form of memory. Illustrated within memory 152 is rack-level power management and control (RPMC or PMC) firmware 160, which is inclusive of the firmware that controls the operation of MC 144 in communicating with and managing the down-stream components (i.e., blocks 162 and computing nodes 110, etc.) of IHS 100. I/O interface 154 provides connection points and hardware and firmware components that allow for user interfacing with the MC 144 via one or more connected I/O devices, such as a keyboard, a mouse, and a monitor. I/O interface 154 enables a user to enter commands via, for example, a command line interface (CLI), and to view status information of IHS 100.

I/O interface 154 also enables the setting of operating parameters for IHS 100, among other supported user inputs. RSD interface 156 enables insertion or connection of an RSD 164, such as a storage device (SD) card containing pre-programmable operating firmware for IHS 100. In at least one embodiment, a RSD 164 stores a copy of the operating parameters of IHS 100 and the RSD 164 can be utilize to reboot the IHS 100 to its operating state following a system failure or maintenance shutdown. Storage 158 can be any form of persistent storage and can include different types of data and operating parameters (settings) 166 utilized for functional operation of IHS 100. Among the stored content within storage 158 may also be algorithms 168 for fan and/or power and/or control. For example, the algorithms 168 can facilitate hot swapping of storage devices 114. In one or more embodiments, IHS 100 can optionally include at least one other MC, illustrated as secondary MC 170, to provide a redundant configuration of MCs 144/170 which are both simultaneously active and functioning. With these embodiments, the redundant configuration enables IHS 100 to continue operating following a failure of either of the MCs 144/170 or in the event one of the MCs 144/170 has to be taken offline for maintenance.

Infrastructure manager 146 includes cooling subsystem interface 172, Ethernet switch 174, power distribution interface 176 and network interface 178. Network interface 178 enables IHS 100 and specifically the components within IHS 100 to connect to communicate with or via an external network 179.

In addition to the above described MC 144 and IM 146, IHS 100 further comprises a fan and cooling subsystem 185, power subsystem 180, and a plurality of processing blocks 162, individually labeled as blocks A-D 162a-162d. In one implementation, each block 162 has an associated block controller (BC) 182. Each block 162 may be enclosed within a block chassis 183 that is inserted to the rack 102 with connectors and conductors aligned for automatic engagement. Alternatively, a cable extension arm can facilitate electrically connecting the block chassis 183 prior to full insertion with the cable extension arm 132 protecting integrity of conductors and cables. The cable extension arm 132 may also allow for utilization within the rack 102 of block chassis 183 that may be of different depths, so that smaller depth blocks are accommodated within the rack 102 without damaging cables during insertion or extension.

Cooling subsystem 185 includes a plurality of fan modules, or merely "fans", of which a first fan 186a and a second fan 186b are shown. These fans 186a, 186b are located within a respective fan bay module 188 and can be different sizes and provide different numbers of fans 186 per fan bay module 188. Also included within cooling subsystem 185 is a plurality of temperature sensors 184, which are further shown distributed within or associated with specific blocks 162. Cooling subsystem 185 of IHS 100 further includes some design features of the rack casing 142, such as perforations for air flow and other design features not expanded upon within the present description. As alluded to by the dashed boxes representing the individual fans 186a-186b, each fan bay module 188a-188b is located behind (or in the air flow path of) a specific block 162 and the fan 186a-186b is communicatively coupled to and controlled by the block controller 182 associated with that block 162. Within each block 162 is at least one, and likely a plurality, of functional/processing nodes (computing nodes 110). As one aspect of the disclosure, the number of computing nodes 110 that can be placed within each block and/or supported by a single block controller 182 can vary up to a maximum number (e.g., 16) based on the block dimension relative to the size and configuration of each computing node 110. Additionally, as provided by block D 162d one or more of the blocks can be utilized to provide rack-storage of storage devices 114. Also, as shown with blocks B 162b and C 162c, a single block controller 182b can be assigned to control multiple blocks 162b-162c, when the number of computing nodes 110 within an individual block does not exceed the pre-established block controller (BC) threshold. In at least one implementation, the BC threshold can be set to 16 nodes. Each computing node 110 controlled by a respective block controller 182 is communicatively coupled to block controller 182 via one or more cables.

Ethernet switch 174 enables MC 144 to communicate with block controllers 182 via a network of Ethernet cables 190. Specifically, according to at least one embodiment, MC 144 provides certain control and/or management signals to BCs 182 via one or more select wires within the Ethernet cables 190, which select wires are additional wires within the Ethernet cable 190 that are not utilized for general system and network communication.

Power subsystem 180 generally includes a plurality of power supply units (PSUs) 192, one or more power distribution units (PDUs) 194, and a modular busbar 196. Power subsystem 180 also includes a source of external power (not shown), assumed to be AC power 198. Each of the individual computing nodes 110 and other components within the IHS 100 that require power are either directly coupled to modular busbar 196 or coupled via power cables to PDUs 194 to obtain power. As one aspect of power distribution within IHS 100, MC 144 can monitor power consumption across the IHS 100 as well as the amount of available power provided by the functional PSUs 192 and trigger changes in power consumption at the block level and ultimately at the (processing) node level based on changes in the amount of available power and other factors. Control of the power subsystem 180 can, in one embodiment, be provided by a separate power controller 200, separate from MC 144. As further illustrated, one additional aspect of the power subsystem 180 for the IHS 100 is the inclusion of AC switch box 202. AC switch box 202 is communicatively coupled to both IM 146 and power subsystem 180. AC switch box 202 includes a plurality of AC inputs 204 and a plurality of AC outlets 206 that are utilized to supply power to the PSUs 192, and other functional components of the IHS 100 that require AC power.

For purposes of the disclosure all general references to an information handling system shall refer to the rack-level IHS (or RIHS) 100, while references to actual computing nodes 110 within the IHS 100 shall be referenced as chassis level computing nodes 110 or IT components 108. It is further appreciated that within the rack-level IHS 100 can be implemented separate domains or systems that are independent of each other and can be assigned to different independent customers and/or users. However, this level of detail of the actual use of the computing nodes 110 within the general rack-level IHS 100 is not relevant to the descriptions provided herein and are specifically omitted. For clarity, a single rack-level IHS 100 is illustrated. However, an IHS may include multiple racks. For example, one rack may contain only storage sleds with other racks providing computing nodes. In an exemplary embodiment, components of the IHS 100 are organized into a hierarchy as described in TABLE A:

TABLE A

| Level | Device/Module | Acronym | Comments |
|---|---|---|---|
| Domain Level | Management Controller | MC | In front of Power Bay |
| Domain Level | Infrastructure module | IM | In rear of Power Bay |
| Domain Level | AC Switch Box | ACSB | Behind network switches |
| Domain Level | Power Bay Power Module | PBPM | Connects to 10 supplies and two MCs. Designed by Delta |
| Domain Level | Power Bay | Power Bay | Holds PBPM, MCx2, IM, & ACSB |
| Block Level | Block Controller | BC | Hot plug Fan controller + Serial & node interface |
| Block Level | Block Controller Distribution Board (BCDB) | BCDB | Fixed in Block |
| Block Level | Power Interface Board | PIB | Columns of 4 nodes |
| Block Level | Temperature Probe Board | TPB | Ambient Temperature Sensor |
| Node Level | Node Power Distribution Board | NPDB | In each node |
| Node Level | 4 drive HDD BP | x4HDDBP | Used in 12 drive FW HP sled |
| Node level | 2 drive HDD PB | x2HDDBP | Used for HP 2.5" in HW sled |

Further, those of ordinary skill in the art will appreciate that the hardware components and basic configuration depicted in the various figures and described herein may vary. For example, the illustrative components within IHS 100 are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

Figure 2:
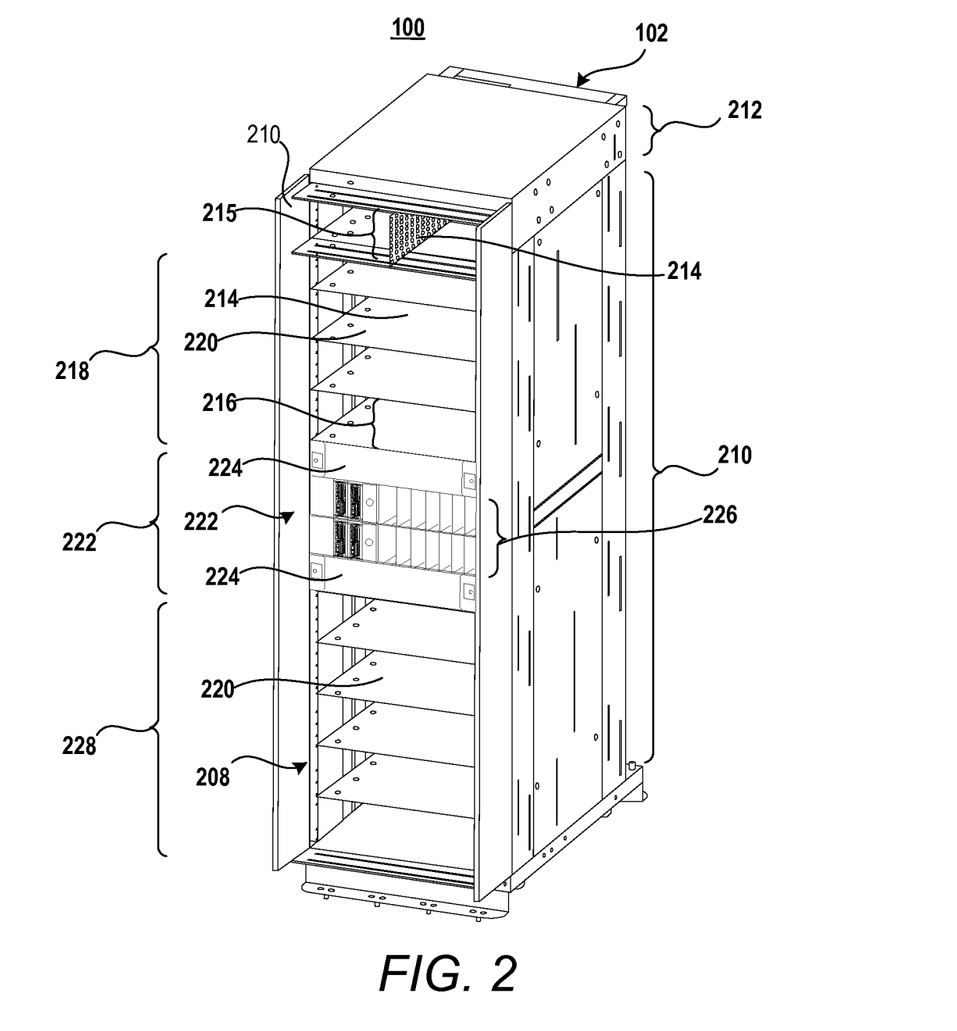
FIG. 2 illustrates a front isometric view of an example rack prior to insertion of functional components for the rack to operate as an IHS, according to one or more embodiments.

FIG. 2 illustrates a front isometric view 200 of an example rack 102 that is ready to receive functional components within both a standard rack portion 210 and an optional rack portion 212 attached on top thereof. In an illustrative configuration, the optional rack portion 212 can be divided vertically by a partition 214 into two half IT bays 215. The standard rack portion 210 may be configured with an upper 20 GU server zone 218 divided horizontally into four tiers by shelves 220 and also undivided vertically by any partitions to form full width IT bays 216. Then, a central portion 222 of the rack 102 includes a switch bay 224 (2 U), two power bays 226 (3 GU×2), and another switch bay 224 (2 U). A lower 25 GU server zone 228 may be divided into five tiers by shelves 220 into full-width IT bays 216. Extension of the storage sled concepts to other fractional width IT bays is also possible, in alternate embodiments, where the storage sled is itself designed to have a width that is equivalent of the fractional width of IR components supported within the rack chassis.

Figure 3:
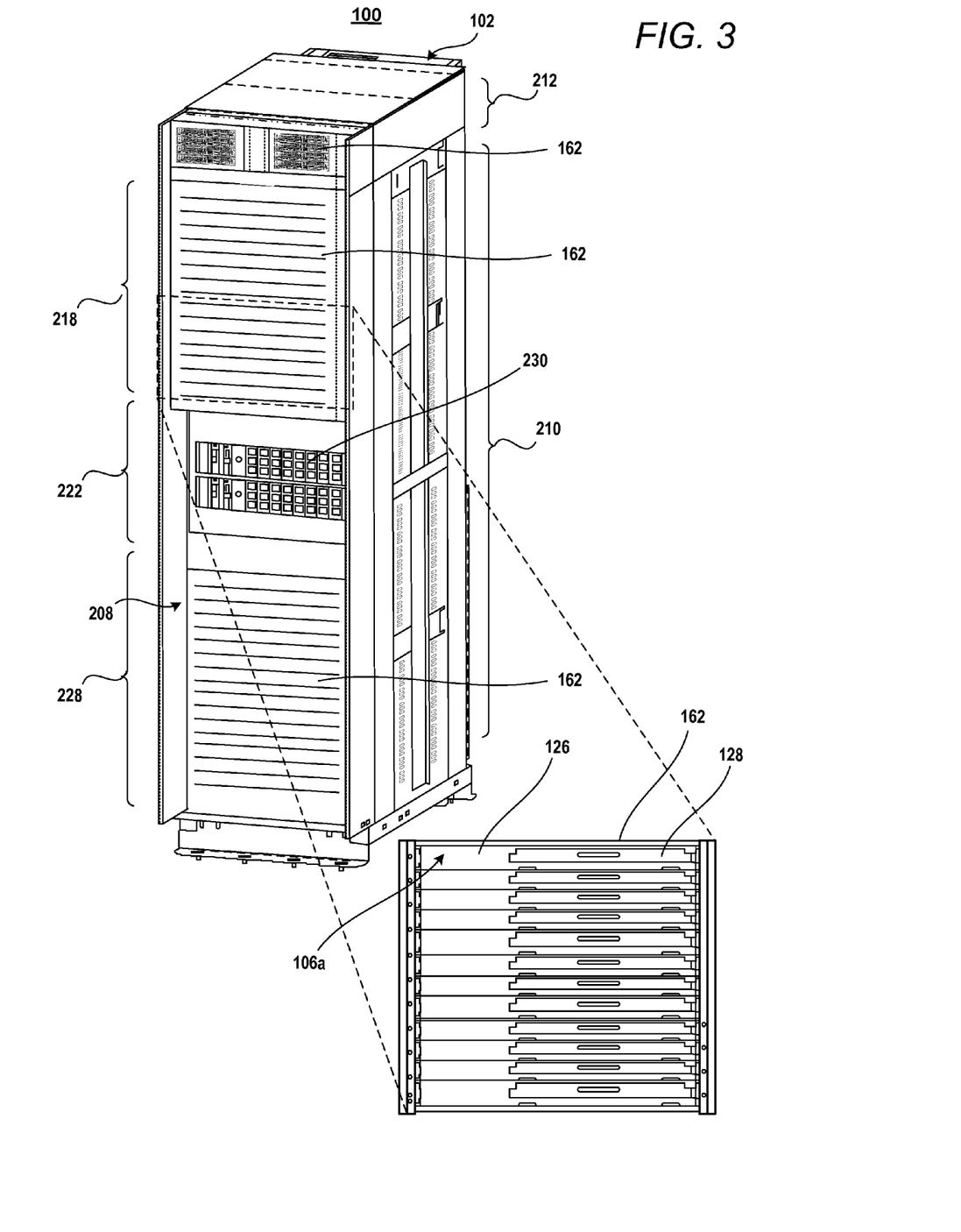
FIG. 3 illustrates a front isometric view of the example rack of FIG. 2 after insertion of functional components for the rack to operate as an IHS, according to one embodiment.

FIG. 3 illustrates the example rack 102 having functional components inserted therein to operate as a rack-based IHS 100. In an illustrative configuration, the optional rack portion 212 has received 1×5 GU blocks 162. Similarly, the upper 20 GU server zone 218 of the standard rack portion 210 contains 4×5 GU blocks 162 including storage sleds 106a each having a movable tray 128 received in a stationary tray 126. Then, the two power bays 226 of the central portion 222 of the rack 102 contain power bay chassis 230. A lower 25 GU server zone 228 has received 5×5 GU blocks.

Figure 4:
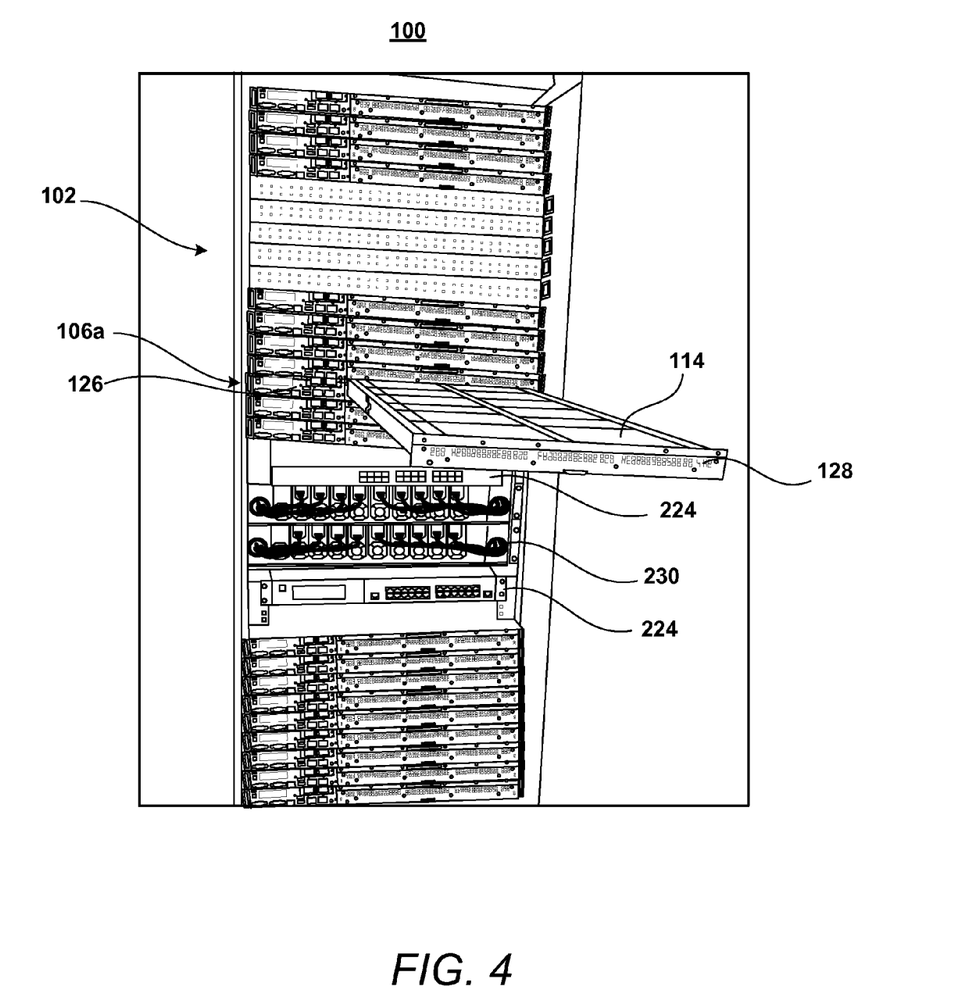
FIG. 4 illustrates a front view of a rack-based IHS with a storage sled in a service position, according to one embodiment.

FIG. 4 illustrates the rack-based IHS 100 having inserted therein a plurality of sleds, including at least one storage sled 106a. Storage sled 106a is shown having a movable tray 128 extended to a service position from the stationary tray 126 to expose horizontally arrayed storage devices 114. Referencing FIG. 1, gripping component (not explicitly shown) for each storage device 114 is lowered to a flush position confirming proper seating or locking of each storage device 114.

Figure 5:
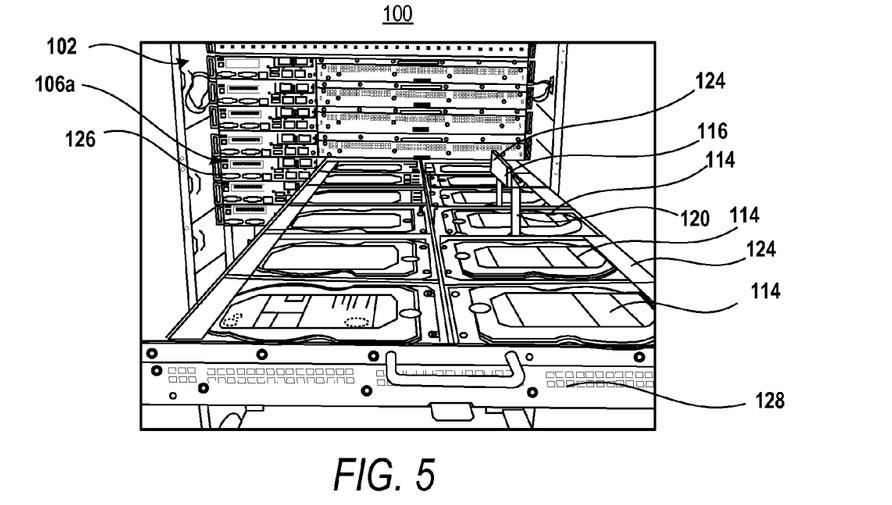
FIG. 5 illustrates a front view of the rack-based IHS of FIG. 4 with a latching handle raised of a storage device in the storage sled, according to one embodiment.
Figure 6:
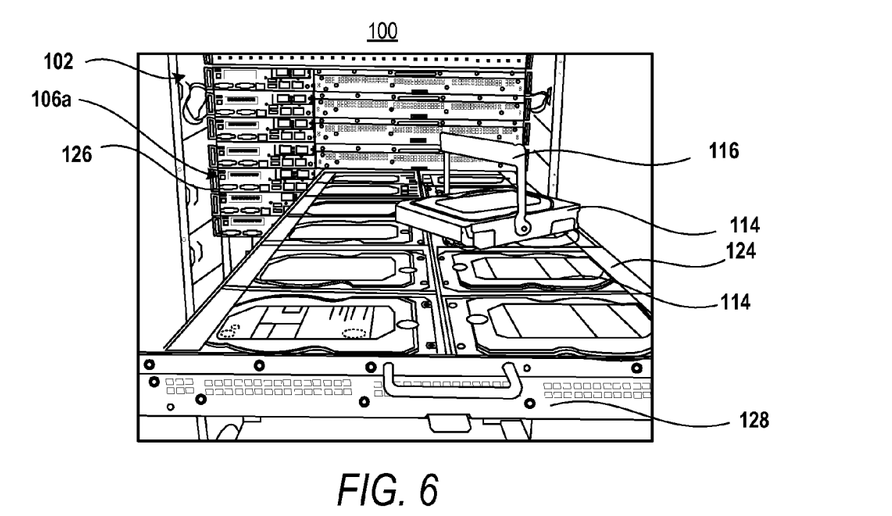
FIG. 6 illustrates a front view of the rack-based IHS of FIG. 5 with the storage device disengaged from the storage sled, according to one embodiment.

FIG. 5 illustrates the latching handle 116 raised on a selected storage device 114 that remains engaged in the movable tray 128 of the storage sled 106a. FIG. 6 then illustrates the selected storage device 114 lifted out of the movable tray 128 of the storage sled 106a.

Figure 7:
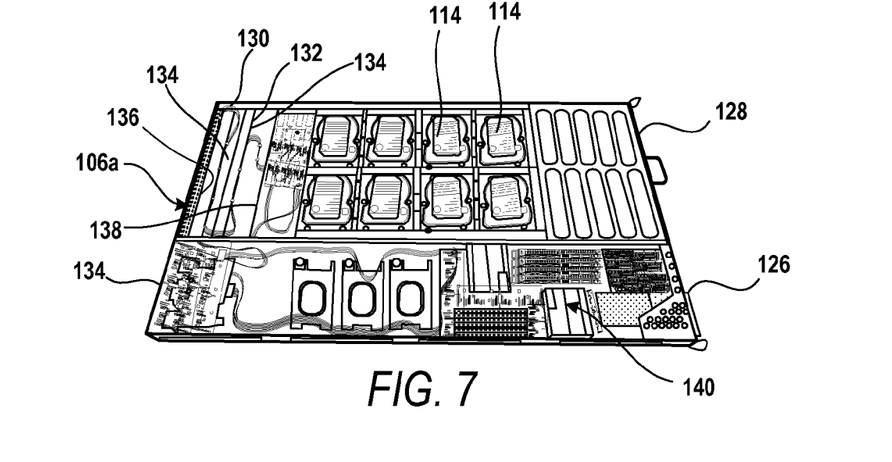
FIG. 7 illustrates a side isometric view of the storage sled of FIG. 4 with a movable tray inserted into a stationary tray, according to one embodiment.
Figure 8:
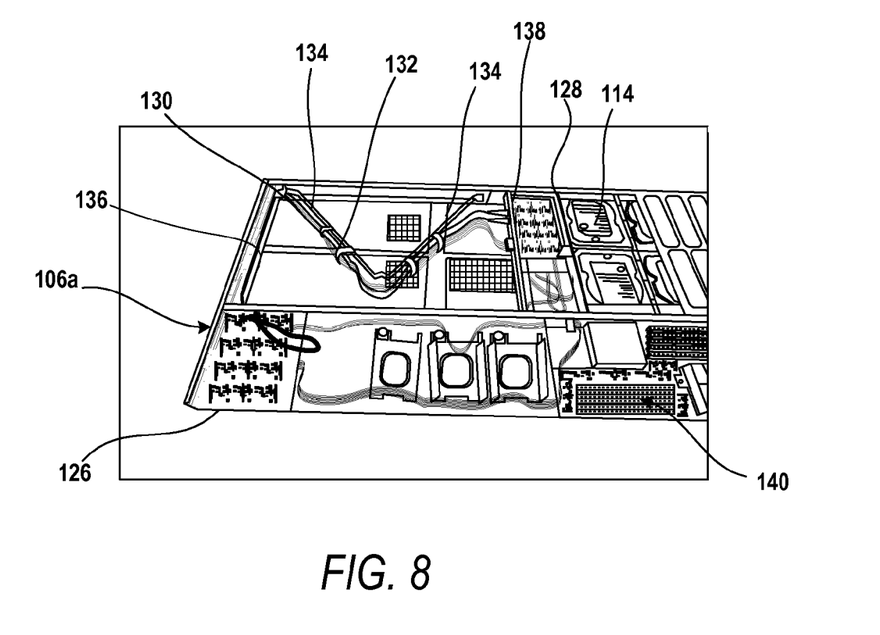
FIG. 8 illustrates a side isometric view of the storage sled of FIG. 7 with the movable tray extended from the stationary tray, according to one embodiment.

FIGS. 7-8 illustrate an aspect of the present disclosure that facilitates extending a movable tray 128 of a storage sled 106a to a service position. In one embodiment, the storage sled 106a includes the stationary tray 126 and the movable tray 128. The movable tray 128 is slidable and is received within the stationary tray 126 of the storage sled 106a. One or more flexible power and signal cables 130 reside in the stationary tray 126.

In one embodiment, the storage sled 106a further comprises a cable extension arm 132 to which the one or more flexible power and signals cables 130 may be lengthwise attached. The cable extension arm 132 may include two or more arm segments 134 that are pivotally attached to one another. Terminal ends of cable extension arm may be pivotally attached respectively to an inner end 136 of the stationary tray 126 and an inserted side 138 of the movable tray 128. The cable extension arm 132 is positioned to be moveable between a stowed position and a service position of the movable tray 128. Other functional components 140 such as drive controllers may reside in the stationary tray to communicate with and functionally support the HSBs 112 in the movable tray 128.

Figure 9:
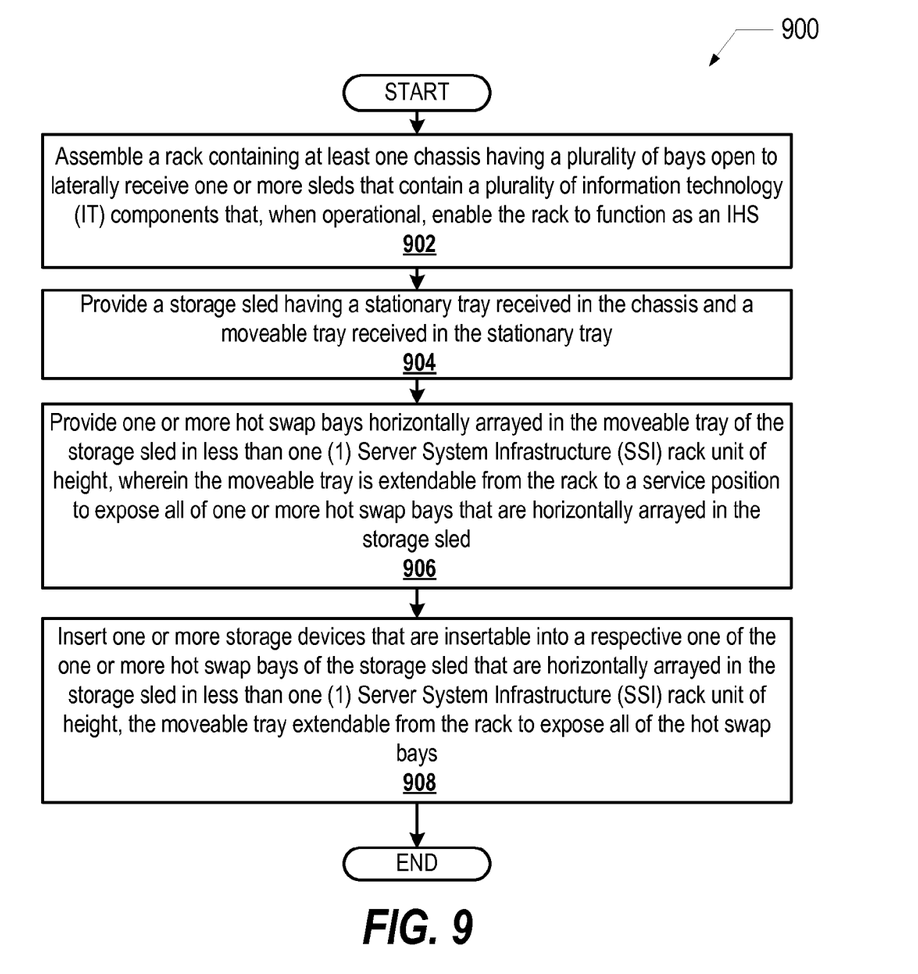
FIG. 9 illustrates a flow diagram of a method for providing a storage sled to support hot swapping of storage devices for a modular, scalable/expandable rack-based IHS, according to one embodiment.

FIG. 9 illustrates a method 900 for providing a storage sled to support hot swapping of storage devices for a modular, scalable/expandable rack-based IHS. The method 900 includes assembling a rack containing at least one chassis having a plurality of bays open to laterally receive one or more sleds that contain a plurality of IT components that, when operational, enable the rack to function as an IHS (block 902). At block 904, the method 900 includes providing a storage sled having a stationary tray received in the chassis and having a moveable tray received in the stationary tray. At block 906, the method 900 includes providing one or more hot swap bays horizontally arrayed in the movable tray of the storage sled in less than one (1) Server System Infrastructure (SSI) rack unit of height, wherein the moveable tray is extendable from the rack to a service position to expose all of one or more hot swap bays that are horizontally arrayed in the storage sled. In block 908, the method 900 includes inserting one or more storage devices into a respective one of the one or more hot swap bays of the storage sled.

Figure 10:
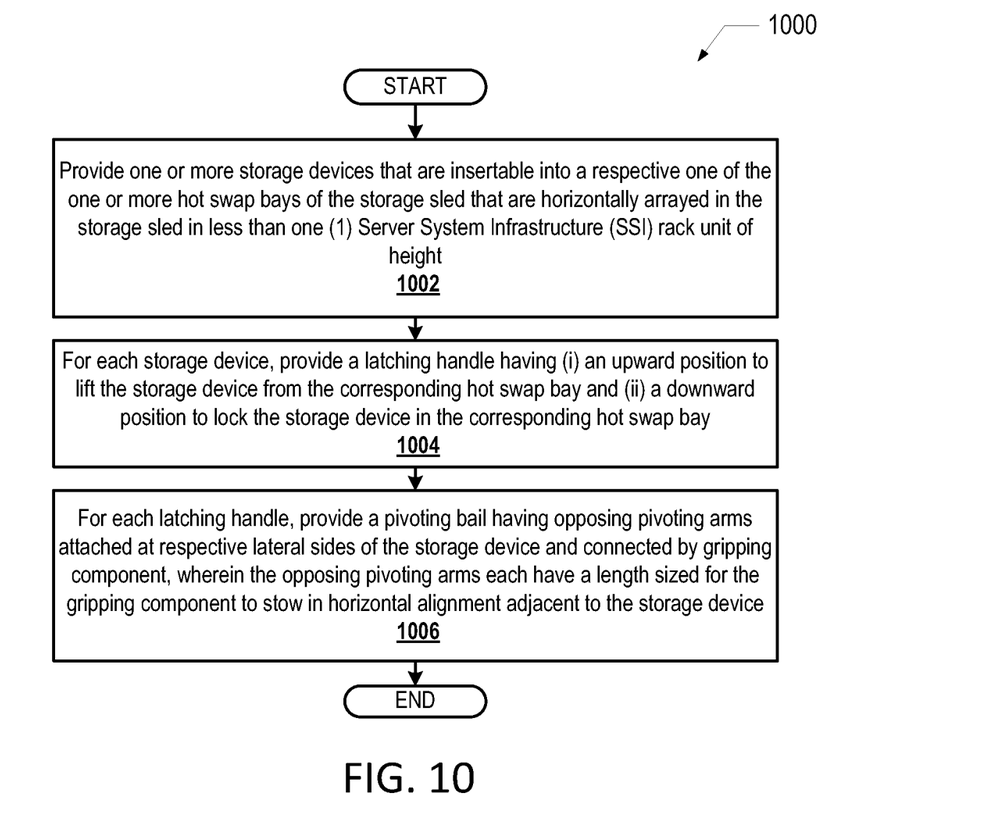
FIG. 10 illustrates a flow diagram of a method for providing storage devices for insertion in a single unit height storage sled utilized within a modular, scalable/expandable rack-based IHS, according to one embodiment.

FIG. 10 illustrates a method 1000 for providing storage devices to support hot swapping of storage devices for a modular, scalable/expandable rack-based IHS. In block 1002, the method 1000 includes providing one or more storage devices that are insertable into a respective one of the one or more hot swap bays of the storage sled that are horizontally arrayed in the storage sled in less than one (1) SSI rack unit of height. In block 1004, the method 1000 includes, for each storage device, providing a latching handle having (i) an upward position to lift the storage device from the corresponding hot swap bay and (ii) a downward position to lock the storage device in the corresponding hot swap bay. In block 1006, the method 1000 includes, for each latching handle, providing a pivoting bail having opposing pivoting arms attached at respective lateral sides of the storage device and connected by gripping component, wherein the opposing pivoting arms each have a length sized for the gripping component to stow in horizontal alignment adjacent to the storage device.

Figure 11:
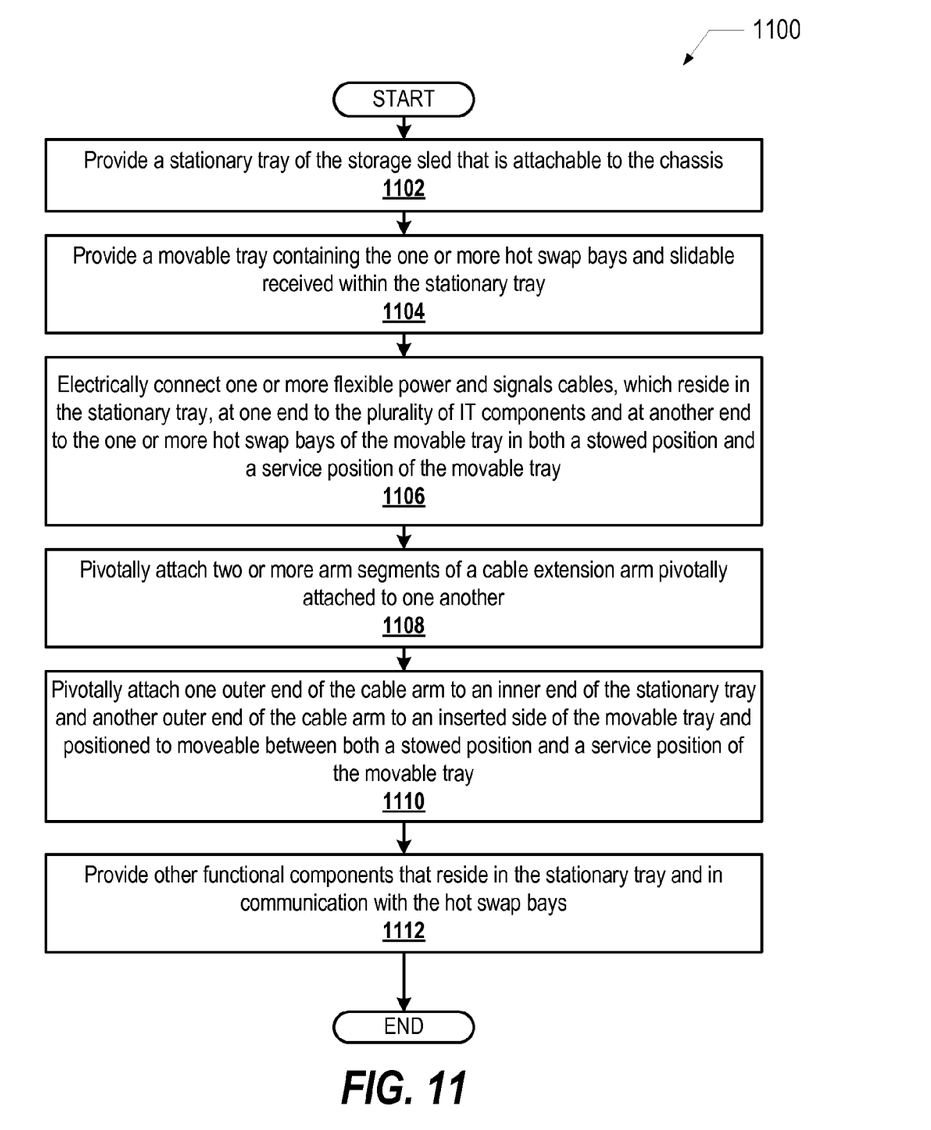
FIG. 11 illustrates a flow diagram of a method for facilitating extension of the sled to a service position for hot swapping the storage devices, according to one embodiment.

FIG. 11 illustrates a method 1100 for facilitating extension of the storage sled to a service position for hot swapping the storage devices that communicate with a plurality of IT components of a rack-based IHS. In block 1102, the method 1100 includes providing a stationary tray of the storage sled that is attachable to the chassis. In block 1104, the method 1100 includes providing a movable tray of the storage sled that contains the one or more hot swap bays and slidable received within the stationary tray. In block 1106, the method 1100 includes electrically connecting one or more flexible power and signal cables, which reside in the stationary tray, at one end to the plurality of IT components and at another end to the one or more hot swap bays of the movable tray. The cable extension arm is positioned to be movable between a stowed position and a service position of the movable tray. In block 1108, the method 1100 includes pivotally attaching two or more arm segments of a cable extension arm pivotally attached to one another. In block 1110, the method 1100 includes pivotally attaching one terminal end of the cable extension arm to an inner end of the stationary tray and another terminal end of the cable extension arm to an inserted side of the movable tray. The cable extension arm is positioned to be movable between a stowed position and a service position of the movable tray. In block 1112, the method 1100 includes providing other functional components that reside in the stationary tray and in communication with the hot swap bays.

In the above described flow charts of FIGS. 9-11, one or more of the methods may be embodied in a manufacturing device/s such that a series of functional processes are performed in an automated assembly line. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A rack-based information handling system (IHS) comprising:
 a rack containing at least one chassis having a plurality of bays open to laterally receive one or more sleds that contain a plurality of information technology (IT) components that, when operational, enable the rack to function as an IHS;
a storage sled comprising:
a stationary tray received in a bay of the chassis;
a moveable tray received in the stationary tray;
one or more hot swap bays that are horizontally arrayed in the storage sled in less than one (1) Server System Infrastructure (SSI) rack unit of height,
wherein the moveable tray is designed to be extendable from the rack to a service position to expose all of one or more hot swap bays; and
one or more storage devices that are insertable into a respective one of the one or more hot swap bays in a horizontal orientation relative to a plane of the respective hot swap bay, wherein each storage device comprises a latching handle having (i) an upward position to lift the storage device from the corresponding hot swap bay and (ii) a downward position to lock the storage device in the corresponding hot swap bay.

2. The rack-based IHS of claim 1, wherein the latching handle comprises a pivoting bail having opposing pivoting arms attached at respective lateral sides of the storage device and connected by gripping component, wherein the opposing pivoting arms each have a length sized for the gripping component to stow in horizontal alignment adjacent to the storage device.

3. The rack-based IHS of claim 1, wherein the storage sled further comprises:
one or more flexible power and signals cables residing in the stationary tray and electrically connected at one end to the plurality of IT components and at another end to the one or more hot swap bays of the movable tray and positioned to be moveable between a stowed position and a service position of the movable tray.

4. The rack-based IHS of claim 3, wherein the storage sled further comprises:
a cable extension arm to which the one or more flexible power and signals cables are lengthwise attached and comprising two or more arm segments pivotally attached to one another, the cable extension arm having terminal ends pivotally attached respectively to an inner end of the stationary tray and an inserted side of the movable tray and positioned to be moveable between a stowed position and a service position of the movable tray.

5. The rack-based IHS of claim 3, further comprising other functional components residing in the stationary tray and in communication with the hot swap bays.

6. A storage sled for a rack-based information handling system (IHS) having a rack containing at least one chassis having a plurality of bays open to laterally receive one or more sleds that contain a plurality of information technology (IT) components that, when operational, enable the rack to function as an IHS, the storage sled comprising:
a stationary tray received in a bay of the chassis;
a movable tray received in the chassis;
one or more hot swap bays that are horizontally arrayed in the storage sled horizontally arrayed in the storage sled in less than one (1) Server System Infrastructure (SSI) rack unit of height, wherein the moveable tray is designed to be extendable from the rack to a service position to expose all of one or more hot swap bays; and
one or more storage devices that are insertable into a respective one of the one or more hot swap bays in a horizontal orientation relative to a plane of the respective hot swap bay, wherein each storage device comprises a latching handle having (i) an upward position to lift the storage device from the corresponding hot swap bay and (ii) a downward position to lock the storage device in the corresponding hot swap bay.

7. The storage sled of claim 6, wherein the latching handle comprises a pivoting bail having opposing pivoting arms attached at respective lateral sides of the storage device and connected by gripping component, wherein the opposing pivoting arms each have a length sized for the gripping component to stow in horizontal alignment adjacent to the storage device.

8. The storage sled of claim 6, further comprising:
one or more flexible power and signals cables residing in the stationary tray and electrically connected at one end to the plurality of IT components and at another end to the one or more hot swap bays of the movable tray and positioned to be moveable between a stowed position and a service position of the movable tray.

9. The storage sled of claim 8, further comprising:
a cable extension arm to which the one or more flexible power and signals cables are lengthwise attached and comprising two or more arm segments pivotally attached to one another, the cable extension arm having terminal ends pivotally attached respectively to an inner end of the stationary tray and an inserted side of the movable tray and positioned to be moveable between a stowed position and a service position of the movable tray.

10. The storage sled of claim 8, further comprising other functional components residing in the stationary tray and in communication with the hot swap bays.

11. A method for providing a storage sled to support hot swapping of storage devices for a modular, scalable/expandable rack-based Information Handling System (IHS), the method comprising:
assembling a rack containing at least one chassis having a plurality of bays open to laterally receive one or more sleds that contain a plurality of information technology (IT) components that, when operational, enable the rack to function as an IHS;
providing a storage sled having a stationary tray received in the chassis and a moveable tray received in the stationary tray;
providing one or more hot swap bays horizontally arrayed in the moveable tray of the storage sled in less than one (1) Server System Infrastructure (SSI) rack unit of height, wherein the moveable tray is designed to be extendable from the rack to a service position to expose all of one or more hot swap bays;
inserting one or more storage devices into a respective one of the one or more hot swap bays in a horizontal orientation; and
providing a latching handle for each storage device having (i) an upward position to lift the storage device from the corresponding hot swap bay and (ii) a downward position to lock the storage device in the corresponding hot swap bay.

12. The method of claim 11, wherein the latching handle comprises a pivoting bail having opposing pivoting arms attached at respective lateral sides of the storage device and connected by gripping component, wherein the opposing pivoting arms each have a length sized for the gripping component to stow in horizontal alignment adjacent to the storage device.

13. The method of claim 11, wherein providing the storage sled further comprises:

electrically connecting one or more flexible power and signals cables, which reside in the stationary tray, at one end to the plurality of IT components and at another end to the one or more hot swap bays of the movable tray and positioned to be moveable between a stowed position and a service position of the movable tray.

14. The method of claim 13, further comprising:

pivotally attaching two or more arm segments of a cable extension arm pivotally attached to one another;

pivotally attaching one terminal end of the cable extension arm to an inner end of the stationary tray and another terminal end of the cable extension arm to an inserted side of the movable tray and positioned to be moveable between a stowed position and a service position of the movable tray.

15. The method of claim 13, further comprising providing other functional components that reside in the stationary tray and in communication with the hot swap bays.

16. A method for providing storage devices to support hot swapping of storage devices for a modular, scalable/expandable rack-based Information Handling System (IHS), the method comprising:

providing one or more storage devices that are insertable into a respective one of one or more hot swap bays horizontally arrayed in a moveable tray of a storage sled of a rack in less than one (1) Server System Infrastructure (SSI) rack unit of height, wherein the moveable tray is designed to be extendable from the rack to a service position to expose all of one or more hot swap bays that are horizontally arrayed in the storage sled; and providing a latching handle for each storage device having (i) an upward position to lift the storage device from the corresponding hot swap bay and (ii) a downward position to lock the storage device in the corresponding hot swap bay.

17. The method of claim 16, wherein the latching handle comprises a pivoting bail having opposing pivoting arms attached at respective lateral sides of the storage device and connected by gripping component, wherein the opposing pivoting arms each have a length sized for the gripping component to show in horizontal alignment adjacent to the storage device.

* * * * *